US009728650B1

(12) United States Patent
Kao et al.

(10) Patent No.: US 9,728,650 B1
(45) Date of Patent: Aug. 8, 2017

(54) THIN FILM TRANSISTOR ARRAY PANEL AND CONDUCTING STRUCTURE

(71) Applicant: HON HAI PRECISION INDUSTRY CO., LTD., New Taipei (TW)

(72) Inventors: Yi-Chun Kao, New Taipei (TW); Hsin-Hua Lin, New Taipei (TW); Po-Li Shih, New Taipei (TW); Wei-Chih Chang, New Taipei (TW); I-Min Lu, New Taipei (TW); I-Wei Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/071,173

(22) Filed: Mar. 15, 2016

Related U.S. Application Data

(60) Provisional application No. 62/278,448, filed on Jan. 14, 2016, provisional application No. 62/278,469, filed on Jan. 14, 2016, provisional application No. 62/278,467, filed on Jan. 14, 2016.

(51) Int. Cl.
*H01L 29/45* (2006.01)
*H01L 27/12* (2006.01)
*H01L 29/786* (2006.01)
*H01L 29/24* (2006.01)

(52) U.S. Cl.
CPC ........ *H01L 29/7869* (2013.01); *H01L 27/124* (2013.01); *H01L 27/1225* (2013.01); *H01L 29/24* (2013.01); *H01L 29/45* (2013.01)

(58) Field of Classification Search
CPC ..... H01L 29/24; H01L 29/45; H01L 29/7869; H01L 27/1225; H01L 27/124
See application file for complete search history.

(56) References Cited

U.S. PATENT DOCUMENTS

| | | | | |
|---|---|---|---|---|
| 6,567,145 B1 * | 5/2003 | Kaneko | ............ | G02F 1/134363 349/139 |
| 7,960,732 B2 * | 6/2011 | Lee | ............ | G02F 1/13458 257/59 |
| 8,569,754 B2 * | 10/2013 | Yamazaki | ............ | H01L 27/124 257/43 |
| 8,755,019 B2 * | 6/2014 | Park | ............ | H01L 27/1288 349/155 |
| 9,159,839 B2 * | 10/2015 | Kim | ............ | H01L 29/7869 |

(Continued)

*Primary Examiner* — Evan Pert
(74) *Attorney, Agent, or Firm* — Steven Reiss

(57) ABSTRACT

A thin film transistor array panel includes a first conductive layer including a gate electrode; a channel layer disposed over the gate; and a second conductive layer disposed over the channel layer. The second conductive layer includes a multi-layered portion defining a source electrode and a drain electrode, which includes a first sub-layer, a second sub-layer, and a third sub-layer sequentially disposed one over another. Both the third and the first sub-layers include indium and zinc oxide materials. An indium to zinc content ratio in the first sub-layer is greater than that in the third sub-layer. The content ratio differentiation between the first and the third sub-layers affects a lateral etch profile associated with a gap generated in the second conductive layer between the source and the drain electrodes, where the associated gap width in the third sub-layer is wider than that that in the first sub-layer.

22 Claims, 9 Drawing Sheets

(56) References Cited

U.S. PATENT DOCUMENTS

| | | | |
|---|---|---|---|
| 2008/0090343 A1* | 4/2008 | Song | H01L 27/1288 438/160 |
| 2011/0031497 A1* | 2/2011 | Yamazaki | H01L 27/1225 257/59 |
| 2013/0299817 A1* | 11/2013 | Park | H01L 29/45 257/43 |
| 2014/0038348 A1* | 2/2014 | Kim | H01L 29/66969 438/99 |
| 2015/0129868 A1* | 5/2015 | Kim | H01L 21/32134 257/43 |

* cited by examiner

THIN FILM TRANSISTOR ARRAY PANEL AND CONDUCTING STRUCTURE

CROSS-REFERENCE TO RELATED APPLICATIONS

This application claims priority from U.S. provisional applications Ser. Nos. 62/278,448, 62/278,467, and 62/278,469, filed on Jan. 14, 2016, which are incorporated herein by reference.

FIELD

The subject matter herein generally relates to display technology, pertains particularly to thin film transistor (TFT) array panel.

TECHNICAL FIELD

In flat panel display devices, thin film transistors (TFT) are used as switching elements for pixel electrodes. A low profile display panel device commonly comprises a gate line arranged to transfer a scanning signal for controlling the thin film transistor and a data line arranged to transfer a signal applied to the pixel electrode, among others. Research efforts have been devoted in an attempt to enhance signal conducting capability for achieving higher panel device performance.

BRIEF DESCRIPTION OF THE DRAWINGS

Implementations of the present technology will now be described, by way of example only, with reference to the attached figures.

DETAILED DESCRIPTION

Figure 1:
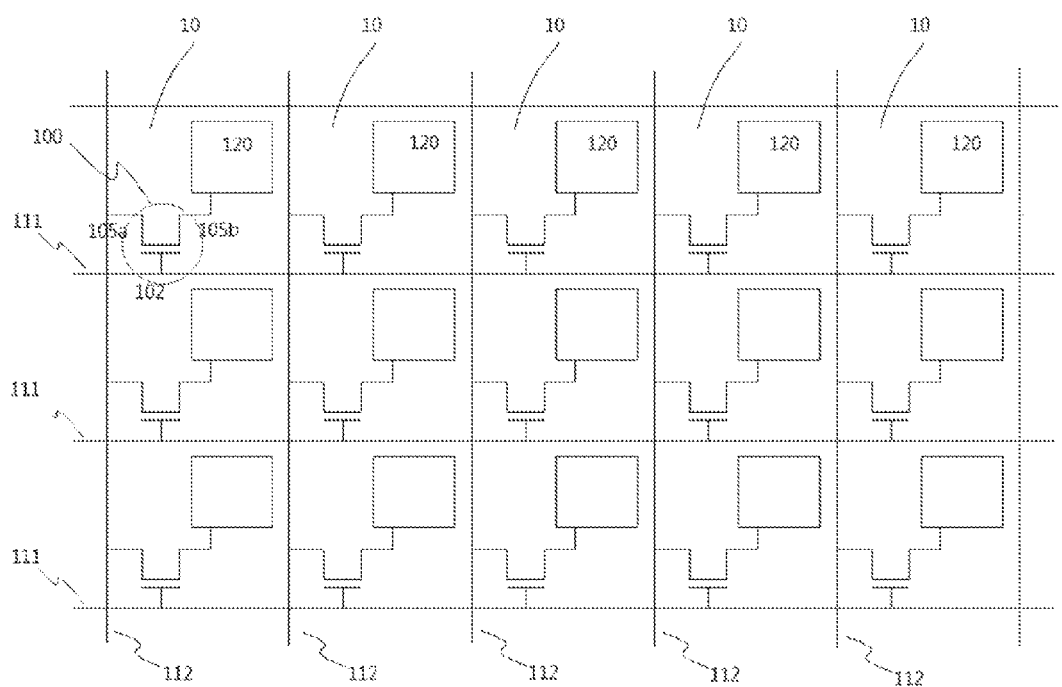
FIG. 1 illustrates a schematic planar layout of a portion of a thin film transistor (TFT) array panel in accordance with some embodiments of the instant disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

For consistency purpose and ease of understanding, like features are identified (although, in some instances, not shown) with like numerals in the exemplary figures. However, the features in different embodiments may differ in other respects, and thus shall not be narrowly confined to what is shown in the figures.

FIG. 1 illustrates a schematic planar layout of a portion of a thin film transistor (TFT) array panel in accordance with some embodiments of the instant disclosure. The schematic illustration of FIG. 1 shows a portion of an exemplary TFT array panel that comprises a [3×5] matrix of TFT pixel elements 10. Each pixel element 10 comprises a TFT switching device 100 and a pixel electrode 120. A TFT switching device (e.g, device 100) is a special type of low profile field effect transistor made by thin films of semiconductive, conductive, and dielectric layers. The thin films of different materials are commonly disposed over a supporting structure, e.g., a non-conductive substrate (not separately labeled). The TFT device 100 is generally a three-terminal element that comprises a gate electrode 102 and a pair of functionally interchangeable source and drain electrodes 105a/b. The pixel electrode 120 is configured to provide liquid crystal (not shown in instant figure) control in a display panel. The pixel electrode 120 is coupled to one of the source/drain terminals (e.g., terminal 105b) of the TFT device 100. The TFT device 100 functions as a switch that selectively turns the connected pixel electrode 120 on and off, thus controls the flow of charge carriers (e.g., holes or electrons) into the pixel electrode region.

The matrix of pixel elements 10 are interconnected through a network of signal conducting lines, which may include a plurality of gate lines 111 (shown to be traversing transversely along the page) connecting the gate terminals (e.g., terminal 102) in a row, and a plurality of data lines 112 (traversing longitudinally along the page) connecting one of the source/drain terminals (e.g., terminal 105a) of the TFT devices 100 in a column. Structurally, the gate lines 111 and the data lines 112 may be formed by one or more patterned conductive layers disposed over the substrate. To conserve precious planar area budget on a substrate, the gate lines 111 and the data lines 112 may be arranged at different elevations (i.e., vertical level) over the substrate in an overlaying fashion. For instance, a signal conducting line may comprise a conductive layer arranged over a substrate and traversing laterally (e.g., in the planar direction over the major surface thereof) between a first region and a second region. The gate line 111 may be used to signal communicatively connect the TFT device 100 with a gate line driver IC located at a first planar region on the substrate (not shown). The data lines 112, on the other hand, may signal conductively couple the TFT device 100 to a source line driver IC located at another planar region defined over the substrate (not shown). In a modern flat panel display, the thin film transistor (TFT) array panel may comprise thousands or even millions of TFT pixel elements 10 arranged in a high dimension matrix to provide high image resolution.

As the network of signal conducting lines are responsible for transmitting control signals between the pixel elements and the control ICs, the signal conducting capability of the signal conducting lines plays an important role in dictating the performance of the flat panel display device, especially for large size and/or high definition device applications. By way of example, allocation of precious planar area on a substrate would be required for the conductive lines. To achieve high pixel density while maintaining device performance, the width in the conducting lines may require miniaturization, while the electrical resistance/impedance thereof ought to be reduced.

Figure 2:
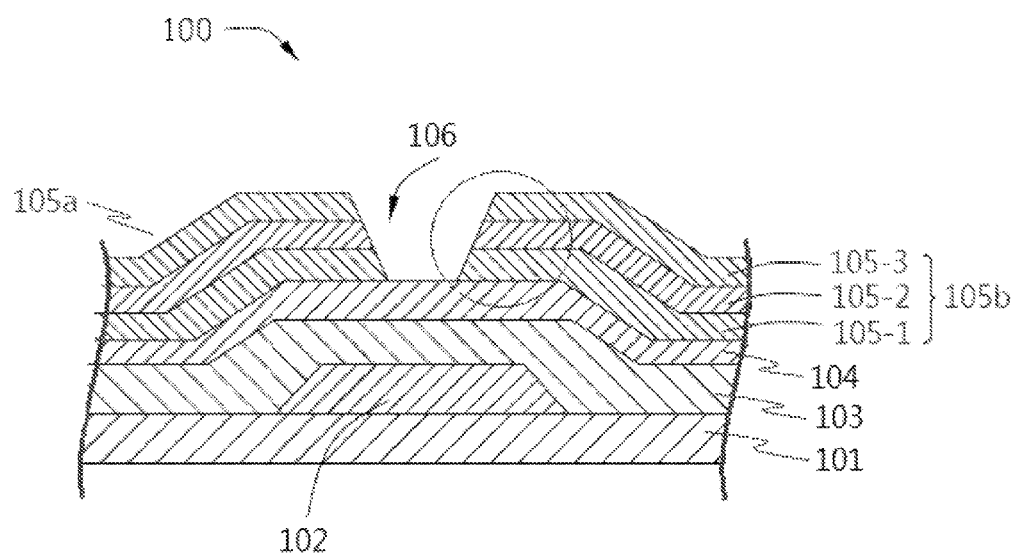
FIG. 2 shows a cross sectional view of a TFT device in an exemplary array panel in accordance with some embodiments of the instant disclosure.

FIG. 2 shows a cross sectional view of a semiconductor device in an exemplary array panel in accordance with some embodiments of the instant disclosure. Particularly, FIG. 2 shows a cross sectional view of an exemplary semiconductor device (e.g., TFT device 100) across both the source and the drain terminals (e.g., S/D electrodes 105a, 105b). The TFT device 100 is disposed on a major surface of a substrate 101 that provides structural support. The substrate 101 typically comprises an insulating material. Suitable materials for the substrate 101 may include glass, quartz, and plastic having sufficient optical transparency (e.g., for electromagnetic radiations in the visible spectrum for visual display applications). In some embodiments, the substrate 101 may comprise ceramic and/or silicon materials. In some applications, flexible substrate materials may be adopted. Suitable choice of material for the flexible substrate may include, for example, polyethersulfone (PES), polyethylenenaphthalate (PEN), polyethylene (PE), polyimide (PI), polyvinyl chloride (PVC), polyethylene terephthalate (PET), and stainless steel, or combinations thereof.

The exemplary TFT device 100 comprises a first conductive layer 102 disposed over the major surface of the substrate 101, an active channel layer 104 disposed over the first conductive layer 102 and insulated there-from by an insulating layer 103, and a second conductive layer (e.g., the layer that defines the electrodes 105a, 105b) disposed over the channel layer 104 and in electrical contact there-with. The first conductive layer 102 disposed over the substrate 101 may be patterned to form an array of first level signal conducting lines. For instance, the first conductive layer 102 may be patterned to form a first level signal conducting array/network over the substrate 101 (e.g., gate lines 111 as shown in FIG. 1), with portions thereof traversing planarly between a first region (e.g., the gate region of a TFT device 100) and a second region (e.g., a gate line driving IC) define on the substrate. In some embodiments, portions of the first conductive layer 102 may be patterned to define the gate electrodes of the TFT device 100 (e.g., the gate terminal as shown in FIG. 1). The integrated signal conducting line (e.g., the gate lines) and the TFT device's gate terminal (e.g., the gate electrode 102) may reduce device complexity (and thus fabrication complexity). The first conductive layer 102 may selectively comprise aluminum (Al), silver (Ag), gold (Au), cobalt (Co), chromium (Cr), copper (Cu), indium (In), manganese (Mn), molybdenum (Mo), nickel (Ni), neodymium (Nd), palladium (pd), platinum (Pt), titanium (Ti), tungsten (W), zinc (Zn), other suitable conductive materials, and a suitable mixture/alloy thereof. For achieving higher optical efficiency, in some embodiments, the first conductive layer 102 may include a transparent conductive material, such as indium tin oxide (ITO), indium zinc oxide (IZO), aluminum doped zinc oxide (AZO), or a suitable combination thereof.

The insulating layer 103 may be provided over selective regions of the first conductive layer 102 to structurally protect the gate electrode 102 (and/or the first level signal conducting lines) and electrically shield the gate region of the TFT device 100 from shorting with other device features. The insulating layer 103 may selectively comprise a suitable dielectric material, such as silicon oxide (SiOx), silicon nitride (SiNx), silicon oxynitride (SiOxNy), aluminum oxide (AlOx), yttrium oxide (Y2O3), hafnium oxide (HfOx), zirconium oxide (ZrOx), aluminum nitride (AlN), aluminum oxynitride (AlNO), titanium oxide (TiOx), barium titanate (BaTiO3), lead titanate (PbTiO3). In some embodiments, one or more high-K dielectric material may be used as gate insulator for the TFT device 100. High-K dielectric materials may include, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. A gate insulating layer comprising high-K dielectric material may be adopted in conjunction with a metal gate material, which generally offers superior electrical performance over conventional polysilicon materials.

In some embodiments, the insulating layer 103 may comprise a multi-layer structure. Depending on application and operational requirements, the multi-layer insulating layer may comprise sub-layers of different dielectric materials and distinct thicknesses. Additional dielectric sub-layers in the gate insulator may enable the tuning of structural interface property, such as reducing interface damage between different material layers or providing additional structural protection. For instance, in some embodiments, the insulating layer 103 comprises a first dielectric sub-layer disposed over the gate insulator and comprises substantially of silicon nitride (SiNx) material, and a second dielectric sub-layer disposed over the first dielectric sub-layer and made substantially of silicon oxide (SiOx). The coverage of gate dielectric layer over the channel layer 104 is of particular importance for preventing potential shorting between gate and the source/drain regions in the TFT device 100.

The channel layer 104 defines the semiconductive/active region of the TFT device 100 through which charge carriers may traverse. As the gate structure (e.g., defined by the first conductive layer 102) is formed vertically under the channel layer 104, such a device architecture may be referred to as the "bottom gate" arrangement. The channel layer 104 may comprise a suitable semiconducting material, which may selectively include an oxide semiconductor, elemental semiconductor, compound semiconductor, and alloy semiconductor material. The semiconductive material may be selectively disposed in one of an amorphous, crystalline, and poly-crystalline state, or a combination of the states. In some embodiments, the channel layer 104 comprises one or more oxide type compound semiconducting material, such as indium-gallium-zinc oxide (IGZO), indium-zinc-tin oxide (IZTO), indium-gallium-tin oxide (IGTO), and indium-aluminum-zinc oxide (IAZO) material. In some embodiments, the channel layer 104 comprises substantially hydrogenated amorphous silicon (a-Si:H). The amorphous silicon channel material, which offers decent charge carrier mobility (e.g., about $0.1$-$1$ $cm^2$ $v^{-1}$ $s^{-1}$) and high thin film uniformity, may be implemented economically for large scale fabrication. In some embodiments, the channel layer 104 comprises polycrystalline silicon material prepared in a low temperature process (e.g., low temperature polycrystalline silicone, LTPS). The LTPS channel material offers superior charge carrier mobility (e.g., about 100-200 $cm^2$ $v^{-1}$ $s^{-1}$), but requires higher fabrication cost, particularly in the application of large size display panel devices.

In some embodiments, the channel layer 104 comprises an oxide semiconducting material that includes one or more of, e.g., zinc (Zn), indium (In), tin (Sn), gallium (Ga), hafnium (Hf). In the present exemplary embodiment, the channel layer 104 comprises indium-gallium-zinc based oxide material (e.g., IGZO). There is no particular limitation on the ratio of the components of the semiconducting oxide material, and additional component may be present in the oxide. The IGZO channel material possesses both high film uniformity and carrier mobility (e.g., tunable through the ratio between its compound components to achieve carrier mobility greater than 10 $cm^2$ $v^{-1}$ $s^{-1}$ and low leakage current), which makes it suitable for large area applications. The high carrier mobility property and low leakage characteristics of the IGZO material may enable further minimization of the device features in a display array panel to achieve increased display resolution.

The second conductive layer (e.g., patterned to define the source/drain electrode 105a/b of the TFT device 100, which may be collectively referred to as conductive layer 105) is disposed over the channel layer 104. For instance, selective portion of the conductive layer 105 may be arranged over the channel layer 104 and in electrical contact there-with. The conductive layer 105 may be arranged to form an array of second level signal conducting lines. As shown in FIG. 1, the conductive layer 105 may be part of the signal conducting network that interconnects an array of pixel elements. For example, the second conductive layer 104 may be patterned to form a second level signal conducting array/network over the substrate 101 (e.g., data lines 112 as shown in FIG. 1), with portions thereof traversing horizontally between one region (e.g., the source/drain region of a TFT device 100) and another region (e.g., a data line driving IC) defined over the substrate. Moreover, portions of the conductive layer 105 may be patterned to define the source and drain electrodes of the TFT devices 100 (e.g., the source/drain terminals as shown in FIG. 1). The integrally formed signal conducting line (e.g., the data lines) and the TFT device terminal (e.g., the source/drain electrodes 105a/b) may reduce device structural complexity (and thus fabrication complexity and cost).

As shown in FIG. 2, the conductive layer 105 is patterned to form the electrically separated source and drain terminals (e.g., source/drain electrodes 105a, 105b) above the gate region (e.g., over the gate electrode 102) of the TFT device 100. The patterning of the conductive layer 105 may be carried out by a suitable etching process (e.g., wet etching) that generates a gap 106 therein that electrically separates one portion of the layer 105 from the other, thus defining a source region (e.g., electrode 105a) and a drain region (e.g., electrode 105b) of the TFT device 100 (of course, the source and the drain of a transistor device is interchangeable). Particularly, FIG. 2 illustrates a generally regular and tapered gap profile between the source and the drain electrodes 105a, 105b. As will be further discussed, a substantially smooth and tapered profile is generally desirable for achieving higher structural integrity and better electrical properties in the TFT device 100.

At least a portion of the conductive layer 105 may comprise a multi-layered structure (e.g., the instant example illustrates a tri-layer structure). For example, at the source/drain region of the TFT device 100, the conductive layer 105 comprises a multi-layered structure that includes a first (e.g., lower) sub-layer 105-1 arranged in electrical contact with the channel layer 104, a second (e.g., middle) sub-layer 105-2 disposed over the first sub-layer 105-1, and a third (e.g., upper) sub-layer 105-3 disposed over the second sub-layer 105-2. However, in some embodiments, a multi-layered arrangement need not be applied throughout the entire conductive layer 105. For instance, certain regions in the second conductive layers 105 may be arranged to comprise a structure of a double or even a single sub-layer layout, depending on particular device requirements and/or other operational design needs.

The upper and the lower sub-layers 105-1/105-3 may be substantially made of a compound conductor that comprises more than one types of chemical elements formulated at particular content ratios. In some embodiments, the first sub-layer 105-1 (which may be referred to as the bottom barrier layer, i.e., BBL) comprises substantially a transparent conductive oxide (TCO) material. Examples of transparent conductive oxide may include indium-tin oxide (ITO), indium-zinc oxide (IZO), gallium-zinc oxide (GZO), aluminum-zinc oxide (AZO), and suitable combinations thereof. The second sub-layer 105-2 (which may be referred to as the middle conductive layer, i.e., MCL) may be substantially made of an effective conducting material. For instance, the second sub-layer comprises at least one of a metal and a metal alloy material. In some embodiments, the second sub-layer comprises at least one of an aluminum (Al), copper (Cu), manganese (Mn), molybdenum (Mo), and molybdenum tungsten (MoW) material. The third sub-layer 105-3 (which may be referred to as the top capping layer, i.e., TCL) may be made of a material comparable to that used in the first sub-layer 105-1, but may be provided with different component composition ratios.

In some embodiments, the abovementioned multi-layered conducting structure may also be implemented in the first level signal conducting array (e.g., to define the gate lines and/or gate electrodes). Nevertheless, the choice of materials and the content composition ratios used in a first level conducting layer (e.g., the gate lines 112) need not be the same as that adopted in the second level conducting layer (e.g., the data lines 111 and the S/D electrodes), and may be selected based on specific design requirements or other practical concerns. In addition, the multi-layered conducting structure in accordance with the instant disclosure may be adopted not only in a "bottom gate" device (such as illustrated in FIG. 2) but also applicable in "top gate" applications.

The provision of the upper and the lower sub-layers 105-1/105-3 may increase adhesiveness between the MCL with the rest of the device structures, thereby enhancing the level of structural integrity in the TFT device 100. Moreover, the upper and the lower sub-layers 105-1/105-3 may comprise suitable materials that function as diffusion barrier layers to allow the implementation of materials having high conductivity yet with active self diffusing properties. For example, copper (Cu) metal (or an alloy thereof) possesses low electrical resistance/impedance, whose superior electrical properties make it suitable for high conductivity applications. However, copper is also an active material that tends to self-diffuse/migrate within a device structure during fabrication process. The diffusion of copper atoms to certain locations (e.g., the channel region) in a device may cause degradation of device performance (i.e., copper contamination). The upper and the lower sub-layers 105-1/105-3 may be implemented to serve as diffusion barrier layers to confine the cupper atoms within the desirable regions in an electronic device, thereby enhancing the signal conducting quality of the device while maintaining device reliability. Moreover, the lower sub-layer 105-1 may provide an Ohmic contact buffering interface between the MCL (e.g., in this case, comprised substantially of copper material) and the channel layer (e.g., in this case, comprised substantially of IGZO material). The material in the first and the second sub-layers 105-1/105-3 of the conductive layer 105 may be selected based on its etching properties, e.g., the etch rate and selectivity. For instance, a conductive oxide material having comparable etch rate with the MCL (e.g., sub-layer 105-2) may be adopted in the upper and the lower sub-layers 105-1/105-3. For example, when the middle sub-layer 105-2 is substantially made of copper, the upper and the lower sub-layers 105-1, 105-3 may comprise substantially ITO or IZO. Mindful selection of the material for the multi-layered conductive structure (e.g., layer 105) may enable significant reduction of fabrication costs. By way of example, wet-etching friendly materials (one example being IZO) may be selected to alleviate the reliance on expensive fabrication equipment (e.g., dry etching device) and/or time inefficient processing procedures.

In some embodiments, the channel layer 104 is provided with an average thickness in the range of about 200 to 350 A (angstrom). In some embodiments, the first sub-layer (BBL 105-1) comprises an average thickness in the range of about 200 to 300 A. In some embodiments, the second sub-layer (MCL 105-2) comprises an average thickness in the range of about 2000 to 3500 A. In some embodiments, the third sub-layer (TCL 105-3) comprises an average thickness of about 200 to 350 A. Nevertheless, the actual layer thickness may be dependent on application requirements and/or other practical concerns.

FIGS. 3a-3d illustrate different etch profiles in the multi-layered conductive layer 105 undergone a patterning process (e.g., corresponds to the regional enlargement view of the circled portion shown in FIG. 2). Particularly, FIGS. 3a-3d illustrate that different composition ratios of the material component in the upper and the lower sub-layers (e.g., TCL 105-3 and the BBL 105-1) affect different lateral etch profiles in the conductive layer 105. The content ratio of the element components in the different sub-layers of the conductive layer 105 may affect a lateral etch profile therein. Accordingly, the tuning of the component content ratios in the upper and the lower sub-layers 105-1, 105-3 (e.g., the content ratio differentiation there-between) may play an essential role in the generation of a desirable lateral etch profile in the TFT device (e.g., device 100).

Figure 3A:
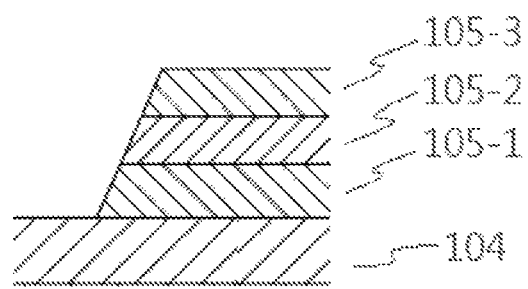
FIGS. 3a-3d illustrate different schematic etch profiles in a multi-layered conductive layer undergone a patterning process.

FIG. 3a illustrates a first lateral etch profile in the conductive layer 105 in a first scenario (under a first sub-layer content ratio arrangement). The etch profile shown in FIG. 3a corresponds to a substantially uniformly slopped, obliquely inclining lateral etch surface, which may provide beneficial structural and electrical characteristics in a TFT device in most applications. In the embodiment shown in FIG. 3a, each of the first and the third sub-layers comprises a metal oxide material containing indium (In) and zinc (Zn). In some instances, the etch rate of the indium (In) component in the conductive layer 105 is noticeably slower than that of the zinc (Zn) component with respect to the etchant employed during the patterning process. While indium (In) generally offers superior electrical conductivity, a delicate balance between the content ratio of indium (In) and zinc (Zn) may be required to strike a practical compromise between the electrical conductive characteristics of the sub-layers and the process-ability thereof.

In the instant embodiment, the indium to zinc content ratio (i.e., the ratio of the indium content to the zinc content, which may be calculated by atomic content ratio or other suitable measures) in the first sub-layer 105-1 is greater than an indium to zinc content ratio in the third sub-layer 105-3 (the content ratio of the substances in the thin film layers may be determined by, for instance, the energy dispersive spectrometer, EDS). Such an indium to zinc content ratio differentiation between the capping and the bottom sub-layers 105-3/105-1 helps to shape a lateral etch profile associated with the gap generated in the conductive layer 105 between the source and the drain electrodes, where the gap width associated there-with in the third sub-layer is wider than that that in the first sub-layer.

Figure 3B:
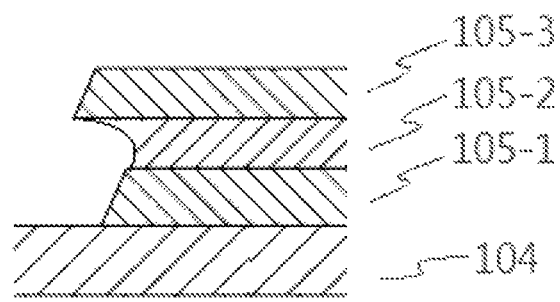

FIG. 3b illustrates a second lateral etch profile in the conductive layer 105 in another scenario (under a different sub-layer content ratio formulation). The etch profile shown in FIG. 3b corresponds to an under-etching situation in the capping sub-layer 105-3, resulting in the generation of an overhang structure in the etched portion of the conductive layer 105. In the instant example, the over-hang feature primarily occurs in the upper sub-layer 105-3. This may be a result of excessive indium content in the upper sub-layer 105-3, thus causing an overly slow etch rate in the top capping layer. An over-hang feature may be undesirable, as such a structural geometry tend to weaken the overall structural integrity of a semiconductor device (e.g., TFT device 100). By way of example, the overhang feature in the TCL 105-3 of the conductive layer 105 inevitably shadows certain regions proximate the underlying sub-layers (e.g., MCL 105-2 and/or BBL 105-1), thus potentially hinders the deposition/formation) of subsequent device features. For instance, voids may be generated in the TFT device proximate the sub-layer interface region between the TCL and the MCL/BBL as a result of the overhang feature. Voids in the TFT device may adversely affect the structural integrity. For example, the upper sub-layer 105-3 (and other device features subsequently formed thereon) may be physically severed (e.g., peeled off) from the lower layers (especially in a flexible panel device application). Also, voids in the conductive structure (e.g., the second level metal layer, such as the conductive layer 105) may alter the electrical property of the device (e.g., parasitic capacitance characteristics).

Figure 3C:
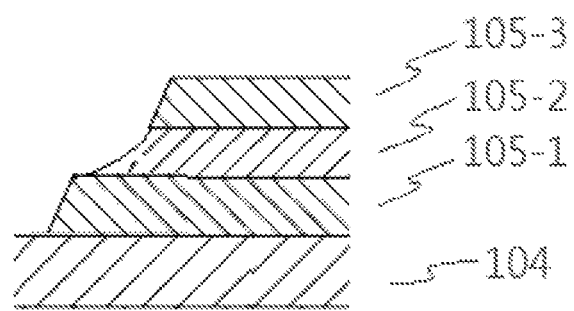

FIG. 3c illustrates a third lateral etch profile in the conductive layer 105 in another scenario (under a different sub-layer content ratio formulation). The etch profile shown in FIG. 3c corresponds to an under-etch situation in the lower sub-layer 105-1, in which a bottom residual tail feature is left in the conductive layer 105. This may be a result of excessive indium content in the lower sub-layer 105-1, thus causing a overly slow etch rate in the bottom barrier layer. In the TFT device, a long residual tail feature in the second level conducting layer (e.g., layer 105) proximate the channel region (e.g., the region above the channel layer 104) may affect the channel length of the TFT device. For instance, the residual tail in the BBL 105-1 may result in a reduction of effective device channel length, thereby impacting the electrical performance of the TFT device. Also, the bottom residual feature may result in an over shallow slop in the lateral etch profile at the channel region (e.g., between the source and the drain electrodes 105a/105b), which may result in higher parasitic capacitance.

Figure 3D:
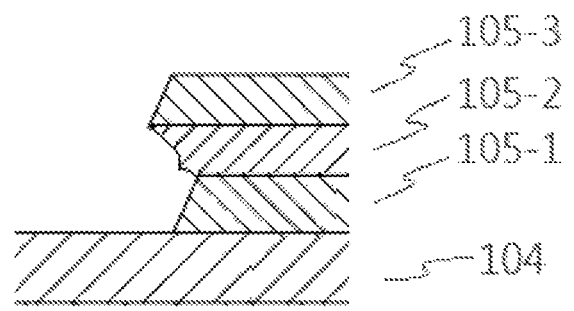

FIG. 3d illustrates a fourth lateral etch profile in the conductive layer 105 in yet another scenario (under a different sub-layer content ratio arrangement). The etch profile shown in FIG. 3d corresponds to an over-etching situation in the bottom sub-layer 105-3, resulting in the generation of an undercut structure in the etched portion of the conductive layer 105. In the instant example, the undercut feature primarily manifests in the bottom sub-layer region. This may be a result of excessive zinc content in the lower sub-layer 105-1 as well as insufficient indium to zinc content ratio differentiation between the TCL 105-3 and the BBL 105-1. As previously discussed, an undercut feature may be undesirable from a structural integrity perspective, as such a condition may weaken the overall structural integrity of a semiconductor device (e.g., TFT device 100). By way of example, voids may be generated in the TFT device proximate (or underneath) an undercut feature, which may adversely affect the structural and electrical properties of the TFT device. As a result, the upper sub-layers (e.g., the MCL 105-2, the TCL 105-3, and other device features subsequently formed thereon) may be more prone to physical damage (e.g., severance from the lower layers), especially in a flexible panel device application.

Please refer back to FIG. 3a. Attentions in certain process conditions may be required during the fabrication of a semiconductor device (e.g., device 100) to generate the structural profile as shown in FIG. 3a. Among them, it is found that the indium to zinc content ratio differentiation may be kept sufficiently large to ensure the generation of a substantially regularly slopped lateral etch profile (as illustrated in FIGS. 2 and 3a). Referring back to FIG. 2, the pair of opposing lateral surfaces formed in the conductive layer 105 (between which the gap 106 is defined) cooperatively shape a substantially tapered gap profile between the source and the drain electrodes 105a, 105b, where a gap width associated with the upper sub-layer (e.g., layer 105-3) is wider than that associated with the lower sub-layer (e.g., layer 105-1).

As discussed previously, the indium to zinc content ratio in the first sub-layer 105-1 is greater than that in the third sub-layer 105-3. To provide further examples, the indium and the zinc contents in the lower sub-layer 105-1 may substantially define a first indium to zinc ratio (i.e., $In_{(BBL)}$:$Zn_{(BBL)}=R_1$, which is a ratio expressible in %). Likewise, the indium and the zinc contents in the upper sub-layer 105-3 substantially define a second indium to zinc ratio (i.e., $In_{(TCL)}$:$Zn_{(TCL)}=R_2$, expressible in %). In the instant embodiment, the multi-layered conductive layer 105 is provided with a first content ratio $R_1$ greater than the second content ratio $R_2$ to achieve a lateral etch profile comparable to that shown in FIGS. 2 and 3a (in other words, $R_1 > R_2$).

For instance, in one embodiment, the indium content in the upper sub-layer 105-3 is about 0.15 units, and the zinc content is about 0.85 units. Accordingly, the indium to zinc content ratio in the upper sub-layer 105-3 (i.e., $R_2 = In_{(TCL)}$:$Zn_{(TCL)}=0.15/0.85$) is about 17.6%. On the other hand, the indium content and the zinc content in the lower sub-layer 105-1 is about 0.35 and 0.65, respectively. Accordingly, the indium to zinc content ratio in the lower sub-layer 105-1 (i.e., $R_1 = In_{(BBL)}$:$Zn_{(BBL)}=0.35/0.65$) is about 53.8%. The content ratio condition in the sub-layers (where $R_1 > R_2$) may thus yield a substantially downward tapered etch profile in the conductive layer 105 comparable to that illustrated in FIG. 2.

The difference of the content ratios between the lower and the upper sub-layers may be larger than a threshold value to preserve favorable process conditions that leads to a desirable lateral etch profile. It is found that an indium to zinc content ratio difference of greater than or equal to 20% between the first and the third sub-layers 105-1, 105-3 would yield a lateral etch profile in the conductive layer 105 with favorable characteristics. Take the previous embodiment as example, the indium to zinc content ratio difference between the lower sub-layer 105-1 and that of the upper sub-layer 105-3 is about 36% (R1-R2=53.8%−17.6%), which satisfies the abovementioned condition. A sufficient content ratio difference that meets the minimum threshold condition may help to prevent the formation of an undesirable undercut feature, such as that illustrated in FIG. 3d.

[As further examples, in some embodiments, the indium to zinc content ratio in the lower sub-layer 105-1 ranges from about 25% to about 80%. In further embodiments, the indium to zinc content ratio in the lower sub-layer 105-1 ranges from about 45% to about 70%. On the other hand, in some embodiments, the indium to zinc atomic ratio in the upper sub-layer 105-3 ranges from about 5% to about 40%. In further embodiments, the indium to zinc atomic ratio in the upper sub-layer 105-3 ranges from about 10% to about 35%. In accordance with embodiments of the instant disclosure, the tuning of the indium to zinc content ratio differentiation between the lower and the upper sub-layers 105-1, 105-3 affects the generation of a substantially smooth and tapered lateral profile for the gap defined between the source and the drain electrodes 105a/105b (e.g., gap 106). Moreover, in some embodiments, the lateral profile associated with the etched gap defined in the conductive layer 105 corresponds to a taper angle of about 40 degrees to 85 degrees with respect to a surface defined by the channel layer. It is noted that, an obtuse taper angle in the lateral etch profile of the conductive layer (e.g., layer 105) creates an overhang/undercut feature that may cause issues in subsequent device feature integration, as discussed previously. On the other hand, an overly acute taper angle in the lateral etch profile of the conductive layer may consume extra planar budget in a high feature density device and adversely impact the channel length of the device. Moreover, an overly shallow taper angle may induce higher parasitic capacitance around the corresponding regions. In some embodiments, a taper angle of about 60 to about 70 degrees in the lateral etch profile of the conductive layer (e.g., layer 105) is achieved through proper process condition tuning to ensure device reliability.

Figure 4:
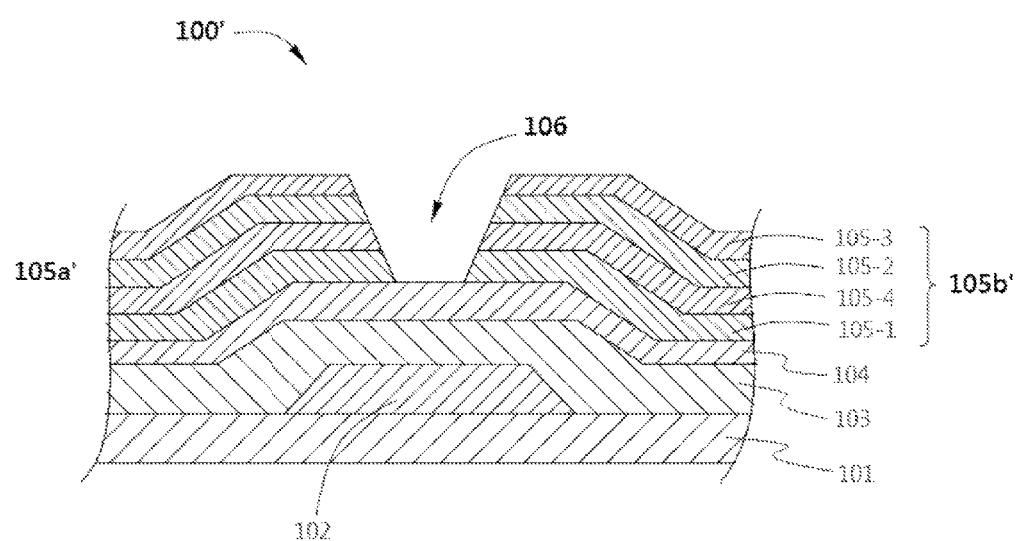
FIG. 4 shows a cross sectional view of a TFT device in an exemplary array panel in accordance with some embodiments of the instant disclosure.

FIG. 4 shows a cross sectional view of a TFT device in an exemplary array panel in accordance with some embodiments of the instant disclosure. Particularly, FIG. 4 shows a cross sectional view of an exemplary TFT device 100' across both the source and the drain terminals (e.g., S/D electrodes 105a', 105b'). As shown in FIG. 4, in some embodiments, the conductive layer 105 may be provided with one or more additional sub-layers. For example, in the instant exemplary embodiment, the conductive layer 105 is further provided with an additional sub-layer 105-4 disposed between the first sub-layer 105-1 and the second sub-layer 105-2. The additional sub-layer 105-4 may also be comprised of a metal oxide layer containing indium and zinc, wherein an indium to zinc content ratio in the additional sub-layer 105-4 is greater than an indium to zinc content ratio in the third sub-layer 105-3 (yet smaller than that in the first sub-layer 105-1). With the insertion of additional sub-layers in the BBL, the etching characteristics in the second level conductive layer (e.g., layer 105) may be preserved, while higher indium content may be employed in the bottom-most sub-layer (e.g., sub-layer 105-1) of the BBL to further improve the electrical properties at the contact interface between the conductive layer 105 and the channel layer 104 (e.g., for Ohm contact reduction). Accordingly, in some embodiments, the indium content in the first sub-layer 105-1 is greater than that in the additional sub-layer 105-4. In some embodiments, the indium content ratio between the indium content in the first sub-layer 105-1 and that in the additional sub-layer 105-4 is in a range of more than 1 to about 1.5. In further embodiments where more than one additional sub-layers are provided in the BBL, the indium content (or, in some cases, the indium to zinc content ratio) in one of the additional sub-layers closer to the first layer 105-1 should be higher than that in the one further away there-from, for similar reasons as previously discussed.

Please refer to FIGS. 5a-5g, which illustrate an exemplary semiconductor device (e.g., TFT device 100) in accordance with some embodiments of the instant disclosure at various stages of fabrication process.

Figure 5A:
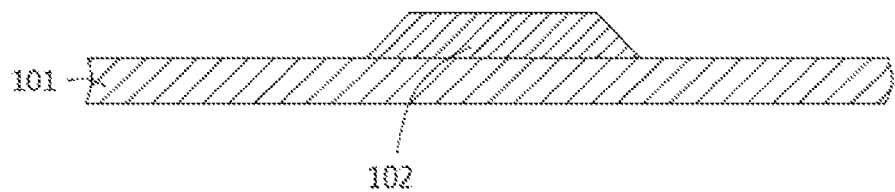
FIGS. 5a-5g illustrate an exemplary TFT device in accordance with some embodiments of the instant disclosure at various stages of fabrication process.

FIG. 5a provides an exemplary regional cross sectional view illustrating the deposition of a first conductive layer (e.g., layer 102) over a major surface of a substrate (e.g., substrate 101). The substrate may comprise an insulating material. In some applications, suitable materials for the substrate may include glass, quartz, and plastic having sufficient optical transparency (e.g., for electromagnetic radiations in the visible spectrum for visual display applications). In some applications, the substrate may comprise ceramic and/or silicon materials. In some applications, flexible substrate materials may be adopted. Suitable choice of material for flexible substrate may include, for example, polyethersulfone (PES), polyethylenenaphthalate (PEN), polyethylene (PE), polyimide (PI), polyvinyl chloride (PVC), polyethylene terephthalate (PET), and stainless steel, or combinations thereof.

The first conductive layer may be disposed over the substrate using suitable deposition techniques, including physical thin film deposition methods such as sputtering (e.g., PVD, PEPVD). The first level conducting layer may then be patterned using suitable etching techniques to define an array of first level signal conducting lines (e.g., gate lines 111 as shown in FIG. 1). For instance, the first conductive layer may be patterned to establish electrical/signal connection between a first region (e.g., the gate region of the TFT device) to a second region (e.g., a date line driving IC) defined over the major surface of the substrate. In some applications, portions of the first conductive layer may be patterned to define the gate electrodes of the TFT devices. The integrated signal conducting line (e.g., the gate lines) and the TFT device terminal (e.g., the gate electrode 102) may reduce device structural complexity and thus fabrication complexity.

The first conductive layer may selectively comprise aluminum (Al), silver (Ag), gold (Au), cobalt (Co), chromium (Cr), copper (Cu), indium (In), manganese (Mn), molybdenum (Mo), nickel (Ni), neodymium (Nd), palladium (pd), platinum (Pt), titanium (Ti), tungsten (W), zinc (Zn), other suitable conductive materials, and a suitable mixture/alloy thereof. For achieving higher optical efficiency, in some embodiments, the first conductive layer may include a transparent conductive material, such as indium tin oxide (ITO), indium zinc oxide (IZO), aluminum doped zinc oxide (AZO), or a suitable combination thereof.

Figure 5B:
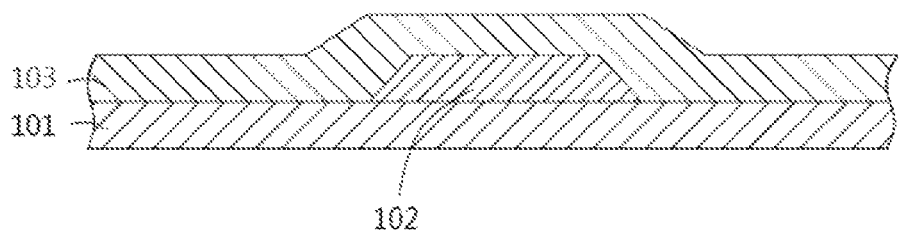

FIG. 5b provides an exemplary regional cross sectional view illustrating the deposition of a gate insulating layer (e.g., layer 103) over the first conductive layer. The gate insulating layer may be disposed via one or more suitable thin film deposition technique (which may include physical and/or chemical thin film deposition methods) to form a protective layer that prevents the conductive gate line structures (e.g., layer 102) from shorting with the subsequently formed device features. The insulating layer may be made of one or more suitable dielectric material, such as silicon oxide (SiOx), silicon nitride (SiNx), silicon oxynitride (SiOxNy), aluminum oxide (AlOx), yttrium oxide (Y2O3), hafnium oxide (HfOx), zirconium oxide (ZrOx), aluminum nitride (AlN), aluminum oxynitride (AlNO), titanium oxide (TiOx), barium titanate (BaTiO3), lead titanate (PbTiO3). In some applications, one or more high-K dielectric material may be used as gate insulator for the TFT device (e.g., device 100). The high-K dielectric material may include, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. A gate insulating layer comprising high-K dielectric material may be adopted in conjunction with a metal gate material, which may offer superior electrical performance over conventional polysilicon materials. In some applications, the insulating layer 103 may be provided with a multi-layer structural configuration.

Figure 5C:
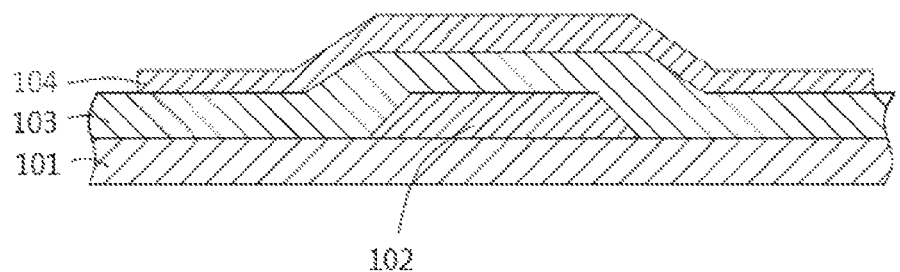

FIG. 5c provides an exemplary regional cross sectional view illustrating the deposition of a channel material layer (e.g., layer 104). The channel material layer may be disposed over the gate insulating layer (e.g., layer 103) using suitable deposition techniques, including physical thin film deposition methods such as sputtering (e.g., PVD, PEPVD). The channel layer may comprise a suitable semiconducting material, selected from at least one of an oxide semiconductor, elemental semiconductor, compound semiconductor, and alloy semiconductor material. The semiconductive material may be selectively disposed in one of an amorphous, crystalline, and poly-crystalline state, or a combination of the states. In some applications, one or more oxide type compound semiconducting material, such as indium-gallium-zinc oxide (IGZO), indium-zinc-tin oxide (IZTO), indium-gallium-tin oxide (IGTO), and indium-aluminum-zinc oxide (IAZO) material, is used in the channel material layer.

The channel layer may then be patterned to define the semiconductive/active region of the TFT device (e.g., device 100) through which charge carriers may traverse. Depending on the choice of channel material, the channel layer may be patterned at this stage using a standalone etching process (which may correspond to a first etch mask, as illustrated in the instant figure). In such a case, the subsequently disposed second level conductive layer (e.g., layer 105 as shown in FIG. 5f) may be separately patterned using a second etching process (which may correspond to a second etch mask). However, in some embodiments, the materials for the channel layer and the second conductive layer are chosen with comparable etching characteristics. The material compatibility between the channel layer and the subsequently disposed second conductive layer may enable a concurrent etching process for patterning both layers using a single etch mask. The reduction in etch mask requirement may significantly lower the process complexity and the fabrication cost. By way of example, in some embodiments, the semiconductive IGZO material and the transparent IZO material are selected as the channel material and the second conductive layer material, respectively, to take advantage of their comparable etching characteristics.

Figure 5D:
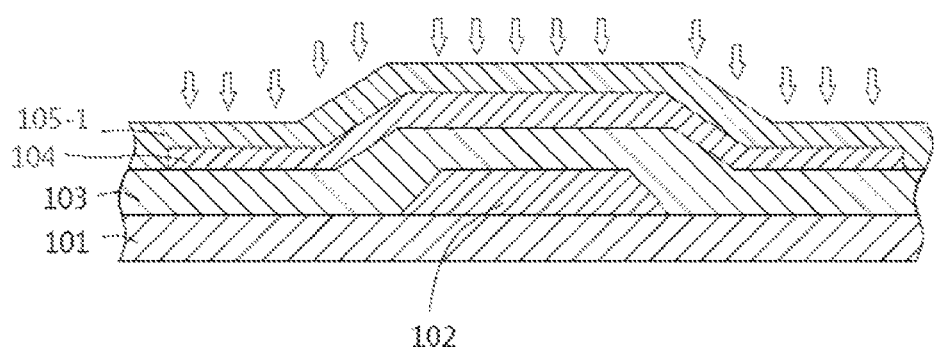

FIG. 5d provides a regional cross sectional view illustrating an initial deposition stage of a multi-layered second conductive structure (e.g., the deposition of the lower sub-layer of the conductive layer 105). In the instant exemplary process, a first (lower) sub-layer (e.g., BBL 105-1) is disposed over the channel layer (e.g., layer 104) via suitable deposition techniques, such as sputtering (e.g., PVD, PEPVD). In some applications, the BBL substantially comprises one or more transparent conductive oxide (TCO) material, such as indium-tin oxide (ITO), indium-zinc oxide (IZO), gallium-zinc oxide (GZO), aluminum-zinc oxide (AZO), or a suitable combination thereof. The BBL may provide an Ohmic contact buffering interface between the channel layer (e.g., of IGZO material) and the subsequently disposed conductive layers (e.g., of Cu material), which may improve the electrical properties at the sub-layer interface (e.g., interface resistance reduction).

Figure 5E:
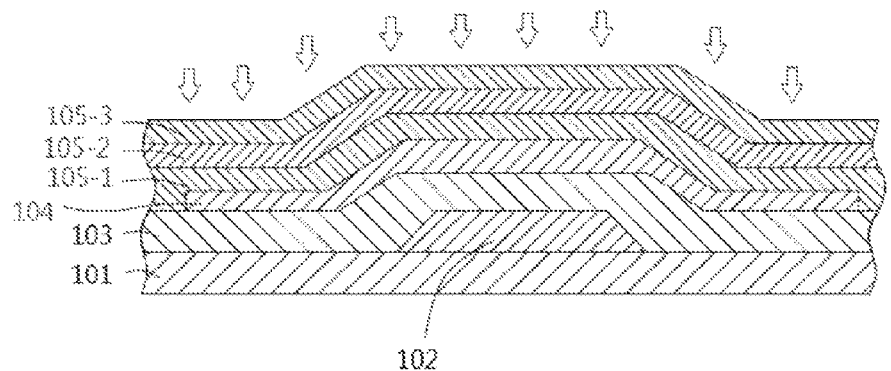
Figure 5F:
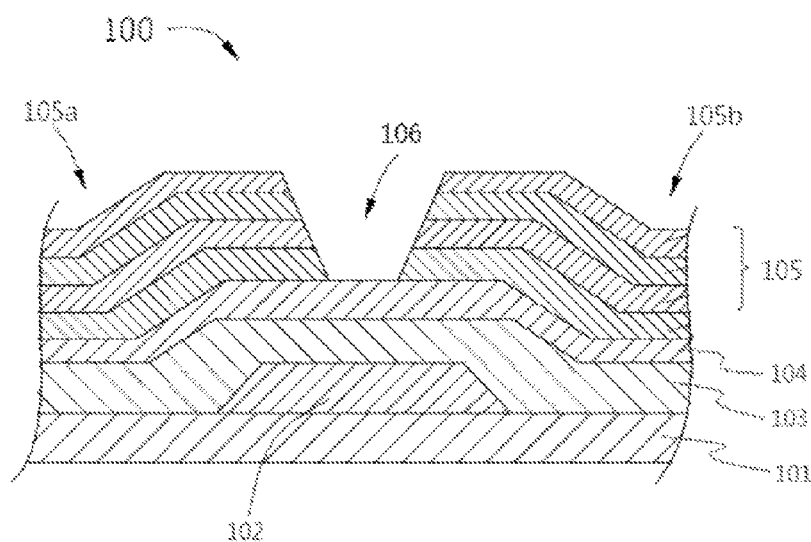

FIG. 5d also illustrates an optional treatment for BBL 105-1. As previously discussed, the conductive layer 105 may comprise a multilayered portion, in which a middle conductive layer (MCL) is disposed over the BBL 105-1 (e.g., layer 105-2 as shown in FIG. 5e). While both the lower and the middle sub-layers are made of substantially conductive materials, the electrical properties thereof may differ. For instance, in the instant example, the lower sub-layer is substantially made of a TCO material (e.g., IZO), while the middle sub-layer is made primarily of a metallic substance (e.g., Cu). To further improve the electrical characteristics at the material interface between the lower and the middle sub-layers, an optional treatment may be implemented to introduce additional hydrogen (H) content into the lower sub-layer (BBL) before the deposition of the middle sub-layer (MCL). The introduction of additional hydrogen content may be done by ammonia plasma treatment, hydrogen annealing process, and/or other suitable methods.

It has been measured that (e.g., using a four point probe resistivity measurement), compared to a barrier sub-layer that does not receive an optional treatment (whose hydrogen content concentration is typically in the order of $10^{-21}$ $cm^{-3}$), a treated lower sub-layer may boost a 20% increase in hydrogen content or more. The increased hydrogen content in the lower sub-layer corresponds to a higher carrier concentration in the thin film structure, therefore helps to improve the electrical properties at the interface region between the hetero-material sub-layers (e.g., further reduced contact resistance). In some embodiments, a BBL that receives a hydrogen treatment may reflect an increase in electrical conductivity of 10% or more.

As previously discussed, sensible selection of the material(s) for the multi-layered conductive structure (e.g., layer 105) may also contribute to the reduction of fabrication costs. By way of example, wet-etching friendly materials (e.g., IZO/Cu/IZO) may be selected to alleviate the reliance on expensive fabrication equipment (e.g., dry etching equipment) and/or associated time consuming processing procedures.

FIG. 5e provides a regional cross sectional view illustrating the deposition of the remaining sub-layers (e.g., layers 105-2, 105-3) of the second conductive layer. The instant figure also shows an optional second treatment for the upper sub-layer (e.g., layer 105-3) thereof. In the illustrated process, a second (middle) sub-layer 105-2 and a third (upper) sub-layer 105-3 are respectively and successively disposed over the lower sub-layer (layer 105-1). Each of the middle sub-layer (MCL) and the upper sub-layer (TCL) may be formed using suitable deposition technique(s), such as sputtering (e.g., PVD, PEPVD). The second sub-layer may be substantially made of a material having good electrical conductivity, such as a metal or a metal alloy. In some applications, the second sub-layer comprises at least one of an aluminum (Al), copper (Cu), manganese (Mn), molybdenum (Mo), and molybdenum tungsten (MoW) material. On the other hand, in some applications, the third sub-layer comprises substantially a transparent conductive oxide (TCO) material, such as indium-tin oxide (ITO), indium-zinc oxide (IZO), gallium-zinc oxide (GZO), aluminum-zinc oxide (AZO), and suitable combinations thereof. The third sub-layer may be made of a material comparable to that used in the first sub-layer, but provided with a different component composition ratio.

Further conductive features (e.g., conductive lines/vias) may be arranged over the upper sub-layer (TCL) and electrically connected thereto (not shown in instant figures) for establishing signal conduction paths from/to the exemplary semiconductor device (e.g., device 100). Therefore, to further improve the electrical characteristics at the material interface between the upper sub-layers and the subsequent conductive features, a second optional treatment may be implemented to introduce additional hydrogen (H) content into the upper sub-layer (TCL) in a similar fashion. As discussed above, compared to a capping sub-layer that does not receive an optional treatment (whose hydrogen content concentration is typically in the order of $10^{-21}$ $cm^{-3}$), a treated lower sub-layer may boost a 20% increase in hydrogen content or more. The increased hydrogen content in the lower sub-layer corresponds to a higher carrier concentration in the thin film structure, therefore helps to improve the electrical properties at the interface region between the hetero-material sub-layers (e.g., further reducing contact resistance). In some embodiments, a TCL that receives a hydrogen treatment may reflect an increase in electrical conductivity of 10% or more.

FIG. 5f provides a regional cross sectional view illustrating a patterning of the second conductive layer for defining a source and a drain electrode of the exemplary semiconductor device. In the instant exemplary process, the second conductive layer (e.g., layer 105) is patterned to form the electrically separated source and drain terminals (e.g., source/drain electrodes 105a, 105b) above the gate region (e.g., over the gate electrode 102) of the device. The patterning of the second conductive layer may be carried out by a suitable etching process (e.g., wet etching) that generates a gap (e.g., recess feature 106) therein that electrically separates the one portion of the second conductive layer from the other, thereby defining a source region and a drain region of the device. As discussed previously, the content ratio of the element components in the different sub-layers of the second conductive layer may affect a lateral etch profile associated with the recess feature 106. By way of example, the tuning of the component content ratios in the upper and the lower sub-layers 105-1, 105-3 (e.g., the content ratio differentiation there-between) may play an essential role in the generation of a desirable lateral etch profile in the TFT device.

In the instant exemplary process, each of the first and the third sub-layers are provided with a metal oxide material containing indium (In) and zinc (Zn). Moreover, the indium to zinc content ratio in the first sub-layer is greater than an indium to zinc content ratio in the third sub-layer. As previously discussed, such an indium to zinc content ratio differentiation between the capping and the bottom sub-layers helps to shape a lateral etch profile associated with the gap generated in the second conductive layer. In addition, the indium to zinc content ratio differentiation is kept above a certain threshold value to ensure the generation of a suitable lateral etch profile. In the instant example, an indium to zinc content ratio difference of greater than or equal to 20% is provided between the first and the third sub-layers to help shaping a proper lateral etch profile in the second conductive layer. In some embodiments, the lateral profile associated with the etched gap defined in the second conductive layer corresponds to a taper angle ranged from about 40 degrees to 85 degrees with respect to a surface defined by the channel layer.

The schematic illustration of FIG. 5f shows a smooth and downwardly tapered etch profile between the source and the drain regions 105a, 105b, which possesses a wider separation width at the top (e.g., at the TCP region) and a narrower width at the bottom (e.g., at the BBL region). It is noted that, subject to different zooms of magnification, it is practically rare to find a precisely/universally linear lateral etched surface (e.g., a straight lateral profile that defines a fixed constant slope). Nevertheless, as previously discussed, proper tuning of the material content ratios in the second conductive layer may enable the generation of a substantially uniformly slopped, obliquely inclining lateral etch surfaces in the second conductive layer (for instance, maintaining a substantially continuously inclining lateral slope without obviously observable profile interruption, e.g., overhang and/or undercut).

Likewise, a precise definition of a fixed taper angle in the lateral etch profile may not be easy in a practical situation. However, as a realistic approach for the determination of the taper angle in situations where the slope of the lateral etched surface is substantially regular and non-interrupted (e.g., no substantial formation of overhang and/or undercut), the taper angle associated with the lateral etch profile may be taken as an average value, e.g., taken as the angle defined between the major surface of the substrate and a line defined between the lower corner of the inclined etched profile in the MCL (e.g., layer 105-2) and the upper corner thereof (e.g., substantially corresponds to the lower point and the upper point of the MCL). Nevertheless, in some situations, a local approach for the determination of a corresponding taper angle may apply.

As previously mentioned, in some embodiments, the second conductive layer may be provided with one or more additional sub-layers. For example, an additional sub-layer (not shown) may be disposed between the first sub-layer (BBL) 105-1 and the second sub-layer (MCL) 105-2. The additional sub-layer may also comprise a metal oxide material containing indium and zinc, wherein an indium to zinc content ratio in the additional sub-layer is greater than an indium to zinc content ratio in the third sub-layer (TCL) 105-3 (yet smaller than that in the first sub-layer 105-1). The insertion of additional sub-layer(s) may preserve the etching characteristics in the second level conductive layer while allowing higher indium content to be employed (e.g., at the bottom-most sub-layer of the BBL), thereby further improving the electrical properties at the contact interface between the conductive layer 105 and the channel layer 104 (e.g., for Ohmic contact reduction). In the applications where more than one additional sub-layers are provided in the BBL, the indium content in one of the additional sub-layers closer to the first layer 105-1 may be higher than that in the one further away there-from.

Figure 5G:
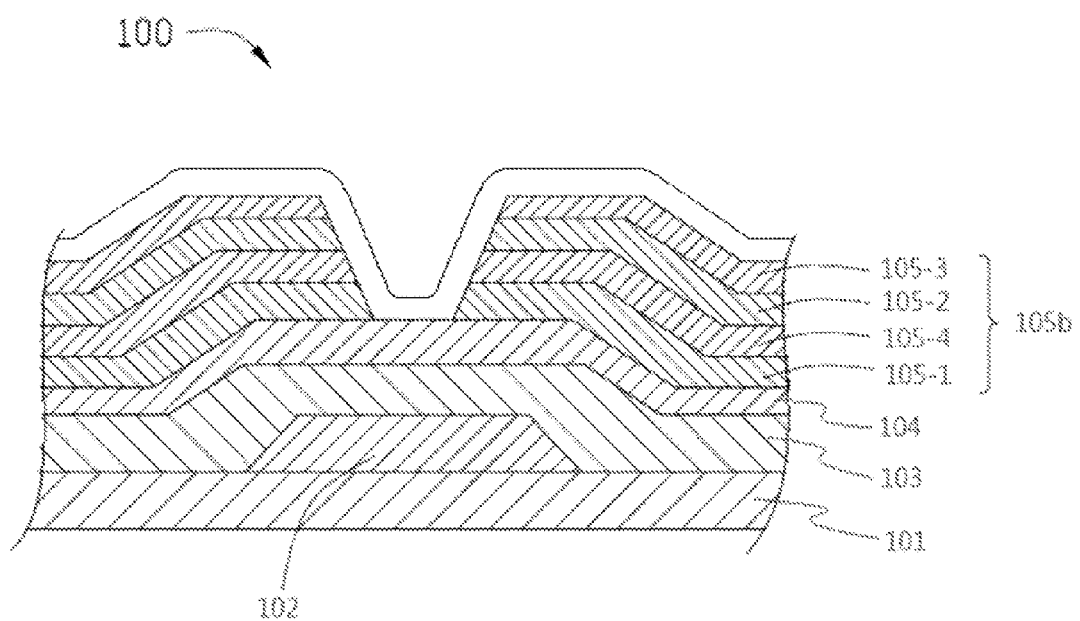

FIG. 5g provides a regional cross sectional view illustrating the deposition of subsequent passivation layer(s) over the source/drain structure of the exemplary semiconductor device (e.g., TFT device 100). For example, one or more passivation layer(s) (e.g., layer 107) may be disposed over the exposed top surface of the second conductive layer (e.g., layer 105), the exposed surface of the lateral etch profile thereof, and the exposed region of the channel material layer (e.g., layer 104). The passivation layer(s) may provide protection for the TFT device from damage during the subsequent fabrication processes. Moreover, certain channel materials (e.g., IGZO) are sensitive to ambient conditions (e.g., oxygen and moisture/water). The passivation layer(s) of suitable dielectric materials(s) (e.g., silicon oxide/nitride) of sufficient thickness over the TFT device 100 may help to protect the delicate device structures from potential environmental hazards. In some embodiments, the passivation layer may be conformally disposed over the exposed surfaces of the TFT device using one or more suitable deposition technique(s) (e.g., chemical deposition methods such as CVD/PECVD/MOCVD). With the passivation layer(s) in place, the semiconductor device may subsequently undergo an annealing process for channel activation.

Accordingly, one aspect of the instant disclosure provides a thin film transistor array panel that comprises a first conductive layer including a gate electrode; a channel layer disposed over the gate electrode and insulated there-from; and a second conductive layer disposed over the channel layer. The second conductive layer comprises a multi-layered portion defining a source electrode and a drain electrode. The multi-layered portion of the second conductive layer comprises at least a first sub-layer arranged in electrical contact with the channel layer, a second sub-layer disposed over the first sub-layer, and a third sub-layer disposed over the second sub-layer. Each of the third and the first sub-layers comprises a metal oxide material containing indium and zinc. An indium to zinc content ratio in the first sub-layer is greater than an indium to zinc content ratio in the third sub-layer. The indium to zinc content ratio differentiation between the first and the third sub-layers affects a lateral etch profile associated with a gap generated in the second conductive layer between the source and the drain electrodes, where a gap width associated there-with in the third sub-layer is wider than that that in the first sub-layer.

Accordingly, another aspect of the instant disclosure provides a conducting structure that comprises: a conductive layer arranged over a substrate and traversing laterally between a first connection region and a second connection region defined thereon, the conductive layer comprising a multi-layered portion. The multi-layered portion of the second conductive layer comprises at least a first sub-layer arranged over the substrate, a second sub-layer disposed over the first sub-layer; and a third sub-layer disposed over the second sub-layer. Each of the first and the third sub-layers comprises a metal oxide layer containing indium and zinc. An indium to zinc content ratio in the first sub-layer is greater than an indium to zinc content ratio in the third sub-layer. The indium to zinc content ratio differentiation between the first and the first sub-layers affects a lateral etch profile of associated with a gap generated in the second conductive layer between the source and the drain electrodes, wherein a gap width associated there-with in the third sub-layer is wider than that that in the first sub-layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A thin film transistor array panel, comprising:
a first conductive layer including a gate electrode;
a channel layer disposed over the gate electrode and insulated from; and
a second conductive layer disposed over the channel layer, the second conductive layer comprising a multi-layered portion defining a source electrode and a drain electrode, wherein the multi-layered portion of the second conductive layer comprises at least:

a first sub-layer arranged in electrical contact with the channel layer, a second sub-layer disposed over the first sub-layer, and a third sub-layer disposed over the second sub-layer;

wherein each of the third and the first sub-layers comprises a metal oxide material containing indium and zinc, wherein an indium to zinc content ratio in the first sub-layer is greater than an indium to zinc content ratio in the third sub-layer, wherein the indium to zinc content ratio differentiation between the first and the third sub-layers affects a lateral etch profile associated with a gap generated in the second conductive layer between the source and the drain electrodes, and wherein a gap width associated there-with in the third sub-layer is wider than a gap width in the first sub-layer.

2. The thin film transistor array panel of claim 1, wherein the indium to zinc content ratio difference between the first and the third sub-layers is not less than 20%.

3. The thin film transistor array panel of claim 2, wherein the indium to zinc content ratio differentiation between the first and the third sub-layers affects a generation of a substantially smooth and tapered lateral profile for the gap defined between the source and the drain electrodes.

4. The thin film transistor array panel of claim 3, wherein the lateral profile associated with the gap defined between the source and the drain electrodes corresponds to a taper angle of about 40 degrees to 85 degrees with respect to a surface defined by the channel layer.

5. The thin film transistor array panel of claim 2, wherein the indium to zinc content ratio in the first sub-layer is in a range from about 25% to about 80%.

6. The thin film transistor array panel of claim 5, wherein the indium to zinc content ratio in the first sub-layer is in a range from about 45% to about 70%.

7. The thin film transistor array panel of claim 2, wherein the indium to zinc content ratio in the third sub-layer is in a range from about 5% to about 40%.

8. The thin film transistor array panel of claim 7, wherein the indium to zinc content ratio in the third sub-layer is a in range from about 10% to about 35%.

9. The thin film transistor array panel of claim 1, wherein the second sub-layer comprises at least one of a metal and a metal alloy material.

10. The thin film transistor array panel of claim 9, wherein the second sub-layer comprises at least one of an aluminum, copper, manganese, molybdenum, and molybdenum tungsten (MoW) material.

11. The thin film transistor array panel of claim 1, wherein the channel layer comprises at least one of a oxide semiconductor, elemental semiconductor, compound semiconductor, and alloy semiconductor material, in at least one of an amorphous, crystalline, and poly-crystalline state.

12. The thin film transistor array panel of claim 11, wherein the channel layer comprises at least one of an indium-gallium-zinc oxide (IGZO), indium-zinc-tin oxide (IZTO), indium-gallium-tin oxide (IGTO), and indium-aluminum-zinc oxide (IAZO) material.

13. A conducting structure, comprising:

a conductive layer arranged over a substrate and traversing laterally between a first and a second connection regions defined thereon, the conductive layer comprising a multi-layered portion, wherein the multi-layered portion of the second conductive layer comprises at least a first sub-layer arranged over the substrate, a second sub-layer disposed over the first sub-layer, and a third sub-layer disposed over the second sub-layer;

wherein each of the first and the third sub-layers comprises a metal oxide layer containing indium and zinc, wherein an indium to zinc content ratio in the first sub-layer is greater than an indium to zinc content ratio in the third sub-layer, wherein the indium to zinc content ratio differentiation between the first and the third sub-layers affects a lateral etch profile associated with a gap generated in the conductive layer, and wherein a gap width associated there-with in the third sub-layer is wider than a gap width in the first sub-layer.

14. The conducting structure of claim 13, wherein the indium to zinc content ratio difference between the first and the third sub-layers is not less than 20%.

15. The conducting structure of claim 14, wherein the multi-layered portion defines a source electrode and a drain electrode; the indium to zinc content ratio differentiation between the first and the third sub-layers affects a generation of a substantially smooth and tapered lateral profile for the gap defined between the source and the drain electrodes.

16. The conducting structure of claim 15, wherein the lateral profile associated with the etched gap defined corresponds to a taper angle of about 40 degrees to 85 degrees with respect to a surface defined by the substrate.

17. The conducting structure of claim 14, wherein the indium to zinc content ratio in the first sub-layer is in a range from about 25% to about 80%.

18. The conducting structure of claim 17, wherein the indium to zinc content ratio in the first sub-layer is in a range from about 45% to about 70%.

19. The conducting structure of claim 14, wherein the indium to zinc content ratio in the first sub-layer is a range from about 5% to about 40%.

20. The conducting structure of claim 19, wherein the indium to zinc content ratio in the first sub-layer is a range from about 10% to about 35%.

21. The conducting structure of claim 13, wherein the second sub-layer comprises at least one of a metal and a metal alloy material.

22. The conducting structure of claim 21, wherein the second sub-layer comprises at least one of an aluminum, copper, manganese, molybdenum, and molybdenum tungsten (MoW) material.

* * * * *